(12) United States Patent
Lee et al.

(10) Patent No.: US 11,929,140 B2
(45) Date of Patent: Mar. 12, 2024

(54) MEMORY CONTROLLER AND STORAGE DEVICE

(71) Applicant: Samsung Electronics Co., Ltd., Suwon-si (KR)

(72) Inventors: Young Min Lee, Seoul (KR); Hyung Jin Kim, Seoul (KR); Seong Wan Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 99 days.

(21) Appl. No.: 17/831,284

(22) Filed: Jun. 2, 2022

(65) Prior Publication Data

US 2023/0109422 A1 Apr. 6, 2023

(30) Foreign Application Priority Data

Sep. 24, 2021 (KR) .......................... 10-2021-0126246

(51) Int. Cl.
*G11C 7/10* (2006.01)
*G06F 13/28* (2006.01)

(52) U.S. Cl.
CPC ............ *G11C 7/1057* (2013.01); *G06F 13/28* (2013.01); *G11C 7/1069* (2013.01); *G11C 7/1084* (2013.01); *G11C 7/1096* (2013.01)

(58) Field of Classification Search
CPC ... G11C 7/1057; G11C 7/1069; G11C 7/1084; G11C 7/1096; G06F 13/28

USPC ...................................................... 365/189.05
See application file for complete search history.

(56) References Cited

U.S. PATENT DOCUMENTS

| | | | |
|---|---|---|---|
| 6,151,641 | A | 11/2000 | Herbert |
| 8,205,019 | B2 | 6/2012 | Brink et al. |
| 9,244,762 | B1 | 1/2016 | Geddes et al. |
| 9,639,457 | B1 | 5/2017 | Piszczek et al. |
| 9,798,688 | B1 | 10/2017 | Bruce et al. |
| 10,649,898 | B2 | 5/2020 | Kim et al. |
| 2019/0332324 | A1* | 10/2019 | Kim ....................... G06F 3/0679 |

* cited by examiner

*Primary Examiner* — Huan Hoang
(74) *Attorney, Agent, or Firm* — Harness, Dickey & Pierce, P.L.C.

(57) ABSTRACT

A memory controller comprising a DMA master device configured to provide a first data group to a non-volatile memory (NVM) device, a program buffer memory configured to temporarily store the first data group before the DMA master device provides the first data group to the NVM device, an exclusive OR computing circuit configured to perform an exclusive OR computation and an accumulation on a plurality of data included in the first data group provided from the program buffer memory to generate a first recovery data, after the DMA master device provides the first data group to the NVM device, and a buffer slave device including a first program recovery buffer memory configured to store the first recovery data and provide the first recovery data from the first program recovery buffer memory to the program buffer memory, in response to a program failure signal, may be provided.

20 Claims, 19 Drawing Sheets

MEMORY CONTROLLER AND STORAGE DEVICE

CROSS-REFERENCE TO RELATED APPLICATION

This application claims priority from Korean Patent Application No. 10-2021-0126246 filed on Sep. 24, 2021 in the Korean Intellectual Property Office, and all the benefits accruing therefrom under 35 U.S.C. 119, the contents of which in its entirety are herein incorporated by reference.

BACKGROUND

1. Field

The present inventive concepts relate to a memory controller and a storage device.

2. Description of the Related Art

A semiconductor memory may be classified into a volatile memory device in which stored data is erased when a power is turned off, and a non-volatile memory device in which the stored data is retained even when the power is turned off. As one of the non-volatile memory devices, a flash memory device is widely used as a large-capacity storage medium of a user device. In recent years, with the development of computing technology, further improved performance is required in a large-capacity storage medium based on the flash memory. As an example, large-capacity storage media based on the flash memory uses a high-speed buffer memory, such as a random access memory, to supplement input and output speeds of a host. Performance improvement is limited due to characteristics such as the capacity limit of the high-speed buffer memory or the reliability guarantee of the data stored in the flash memory.

SUMMARY

Aspects of the present inventive concepts provide a memory controller which has improved product reliability and is miniaturized.

Aspects of the present inventive concepts also provide a storage device which has improved product reliability and is miniaturized.

According to some aspects of the present inventive concepts, a memory controller may include a DMA master device configured to provide a first data group to a non-volatile memory device, a program buffer memory configured to temporarily store the first data group before the DMA master device provides the first data group to the non-volatile memory device, an exclusive OR computing circuit configured to perform an exclusive OR computation and an accumulation on a plurality of data included in the first data group provided from the program buffer memory and generate a first recovery data, after the DMA master device provides the first data group to the non-volatile memory device, and a buffer slave device including a first program recovery buffer memory configured to store the first recovery data, wherein the buffer slave device is connected to the DMA master device through a bus, the buffer slave device is configured to provide the first recovery data from the first program recovery buffer memory to the program buffer memory, in response to a program failure signal indicating that programming of the first data group on the non-volatile memory device is not completed.

According to some aspects of the present inventive concepts, a storage device may include a non-volatile memory device configured to be programmed with a first data group, a DMA master device configured to provide the first data group to the non-volatile memory device and a memory controller including a buffer slave device connected to the DMA master device by a bus, wherein the buffer slave device includes a program buffer memory configured to temporarily store the first data group, before the DMA master device provides the first data group to the non-volatile memory device, and a first program recovery buffer memory configured to store a first recovery data generated by performing a computation on the first data group in response to provision of the first data group, after the DMA master device completes provision of the first data group to the non-volatile memory device.

According to some aspects of the present inventive concepts, a memory controller may include a DMA master device configured to provide a first data group to a non-volatile memory device, a program buffer memory configured to temporarily store the first data group, before the DMA master device provides the first data group to the non-volatile memory device, a buffer slave device including a first program recovery buffer memory, the first program recovery buffer memory configured to store a first recovery data generated by performing a computation on a plurality of data included in the first data group provided from the program buffer memory, after the DMA master device provides the first data group to the non-volatile memory device, a SRAM including the program buffer memory and the first program recovery buffer memory, and a processor configured to control the DMA master device, the buffer slave device, and the SRAM, wherein the processor is further configured to designate a region in the SRAM that corresponds to the program buffer memory configured to store the first data group, and the processor is further configured to designate a region in the SRAM that corresponds to the first program recovery buffer memory configured to store the first recovery data.

However, aspects of the present inventive concepts are not restricted to the one set forth herein. The above and other aspects of the present inventive concepts will become more apparent to one of ordinary skill in the art to which the present inventive concepts pertain by referencing the detailed description of some example embodiments given below.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

Hereinafter, some example embodiments according to the technical idea of the present inventive concepts will be described referring to the accompanying drawings.

Figure 1:
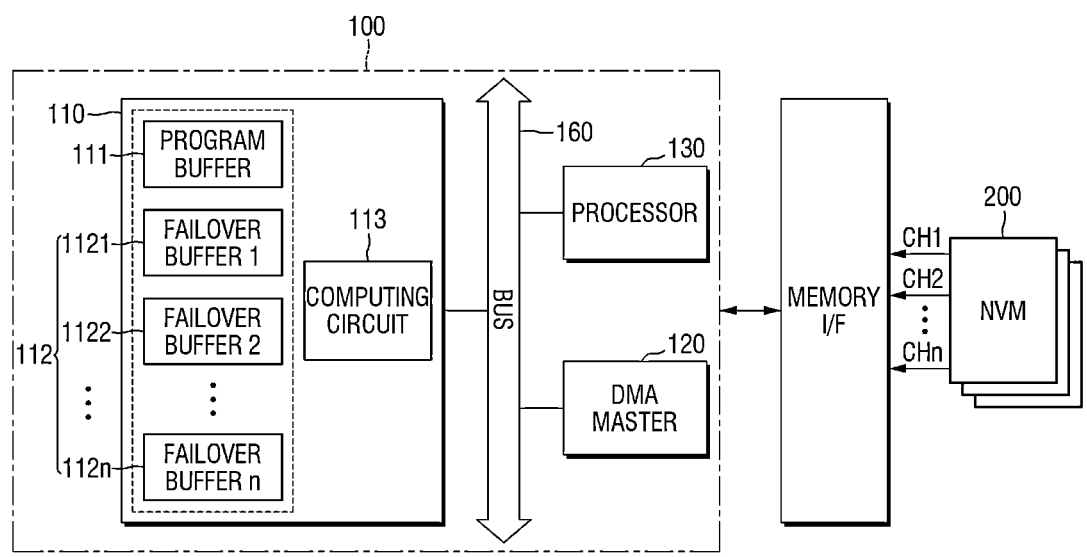
FIG. 1 is a conceptual diagram for explaining a memory controller according to some example embodiments.
Figure 2:
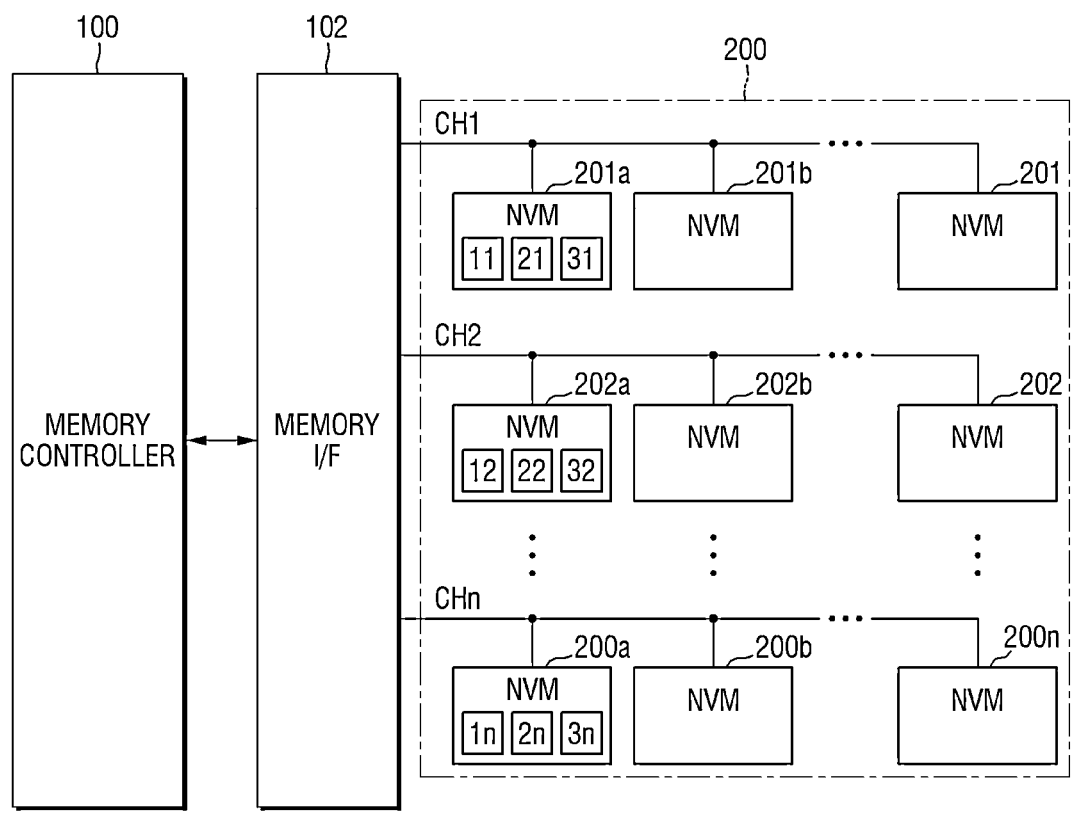
FIG. 2 is a diagram for explaining a non-volatile memory device connected to the memory controller according to some example embodiments.

FIG. 1 is a conceptual diagram for explaining a memory controller according to some example embodiments. FIG. 2 is a diagram for explaining a non-volatile memory device connected to the memory controller according to some example embodiments.

Referring to FIG. 1, a memory controller 100 according to some example embodiments may include a buffer slave device 110, a direct memory access (DMA) master device 120, a processor 130, and a bus 160.

The memory controller 100 may be connected to the non-volatile memory device 200 through a memory interface.

The buffer slave device 110 may include a program buffer memory 111, a program recovery buffer memory 112, and a computing circuit 113.

The buffer slave device 110 may store data desired to program the data in the non-volatile memory device 200. Further, the buffer slave device 110 may store recovery data desired to complete the program when the program on the non-volatile memory device 200 fails.

The program buffer memory 111 may temporarily store data to be programmed in the non-volatile memory device 200. The program buffer memory 111 may provide the temporarily stored data to the DMA master device 120 in response to the request of the DMA master device 120.

The program recovery buffer memory 112 may store the recovery data in case the data temporarily stored in the program buffer memory 111 is not completely programmed in the non-volatile memory device 200. The recovery data stored in the program recovery buffer memory 112 may include data obtained by performing computation on the data stored in the program buffer memory 111 using the computing circuit 113. When the programming is not completed in the non-volatile memory device 200, the programming may be performed on the non-volatile memory device 200 again, using the recovery data stored in the program recovery buffer memory 112. In other words, the buffer slave device 110 may include the program recovery buffer memory 112 and may be configured to provide the recovery data from the program recovery buffer memory 112 to the program buffer memory 111, in response to a program failure signal indicating that the programming of a data group on the non-volatile memory device is not completed.

The computing circuit 113 may perform a desired (or alternatively, preset) computation, using the data stored in the program buffer memory 111, and may provide the recovery data generated by the computing result to the program recovery buffer memory 112. In some example embodiments, the computing circuit 113 may perform an exclusive OR computation. For example, the computing circuit 113 may generate recovery data by performing the exclusive OR computation using a plurality of data stored in the program buffer memory 111, and may provide the recovery data to the program recovery buffer memory 112.

The computing circuit 113 may receive the data stored in the program buffer memory 111 directly from the program buffer memory 111 without going through the DMA master device 120. The computing circuit 113 may compute the data provided from the program buffer memory 111, without using the DMA master device 120, to generate the recovery data.

The DMA master device 120 may request the data temporarily stored in the program buffer memory 111 to provide the data to the non-volatile memory device 200. The DMA master device 120 may provide the data, which is provided from the program buffer memory 111, to the non-volatile memory device 200. For example, the DMA master device 120 may provide the data, which is provided from the program buffer memory 111, to a page buffer connected to a memory cell array of the non-volatile memory device 200 through a bit line (not shown). The DMA master device 120 may provide the data to be programmed in the non-volatile memory device 200 directly to the non-volatile memory device 200 without intervention of the processor 130.

The processor 130 may control the overall operation of the memory controller 100. For example, the processor 130 may control the program buffer memory 111 to provide data to the program recovery buffer memory 112. When the DMA master device 120 provides data to the non-volatile memory device 200, the processor 130 may control the data temporarily stored in the program buffer memory 111 to provide the data to the computing circuit 113. As another example, the processor 130 may designate a region of the buffer memory in which data is stored. This will be specifically described below referring to FIGS. 3 and 4.

Further, the processor 130 may designate a group of data provided by the program buffer memory 111 to the DMA master device 120. This will be specifically described referring to FIGS. 5 to 11.

The bus 160 may connect the buffer slave device 110, the DMA master device 120, and the processor 130. The buffer slave device 110, the DMA master device 120, and the processor 130 may send and receive signals to and from each other through the bus 160.

Referring to FIG. 2, the non-volatile memory device 200 connected to the memory controller 100 may include a plurality of memory chips. The non-volatile memory device 200 may be connected to the memory controller 100 through a plurality of channels. For example, the plurality of memory chips 201a, 201b . . . 201 may be connected to the memory controller 100 through a first channel CH1. The plurality of memory chips 202a, 202b . . . 202 may be connected to the memory controller 100 through a second channel CH2.

The memory controller 100 may select one of a plurality of memory chips connected to a corresponding channel through each channel, and transmit and receive signals to and from the selected memory chip. For example, the memory controller 100 may select a memory chip 201a connected to the first channel CH1. The memory controller 100 may transmit commands, addresses and data to the selected memory chip 201a through the first channel CH1 or receive data from the selected memory chip 201a.

The memory controller 100 may transmit and receive signals in parallel to and from the non-volatile memory device 200 through different channels from each other. For example, the memory controller 100 may transmit the second command to the memory chip 202a through the second channel CH2, while transmitting the first command to the memory chip 201a through the first channel CH1. As another example, the memory controller 100 may receive the second data from the memory chip 202a through the second channel CH2, while receiving the first data from the memory chip 201a through the first channel CH1.

Each of the plurality of memory chips included in the non-volatile memory device 200 may operate according to the control of the memory controller 100. For example, the memory chip 201a may program the first data according to the first command and the first address provided to the first channel CH1. As another example, the memory chip 202a may read the second data according to the second command and the second address provided to the second channel CH2, and may transmit the read data to the memory controller 100.

Each of the plurality of memory chips may store a plurality of data. That is, a plurality of data may be programmed in each of the plurality of memory chips. As shown in FIG. 2, in some example embodiments, one memory chip 201a may store a plurality of data 11, 21 and 31. The plurality of data 11, 21 and 31 stored in the memory chip 201a may each be programmed on different pages. Similarly, the other memory chip 202a may store a plurality of data 12, 22 and 32 programmed on different pages, and the other memory chip 200a may store a plurality of data 1n, 2n and 3n programmed on different pages.

The plurality of data programmed in the plurality of memory chips 201a, 202a . . . 200a connected to the memory controller 100 through different channels may be provided through the same bit line. For example, a plurality of data 11, 12 . . . 1n programmed in different memory chips 201a, 202a . . . 200a may be provided to each of the memory chips 201a, 202a . . . 200a through the same bit line. As another example, a plurality of data 21, 22 . . . 2n programmed in different memory chips 201a, 202a . . . 200a may be provided to each of the memory chips 201a, 202a . . . 200a through the same bit line.

The number of channels that connect the memory controller 100 and the plurality of memory chips of the non-volatile memory device 200 may be variously changed depending on example embodiments. Further, the number of memory chips connected to the memory controller 100 through one channel may be variously changed depending on example embodiments.

Figure 3:
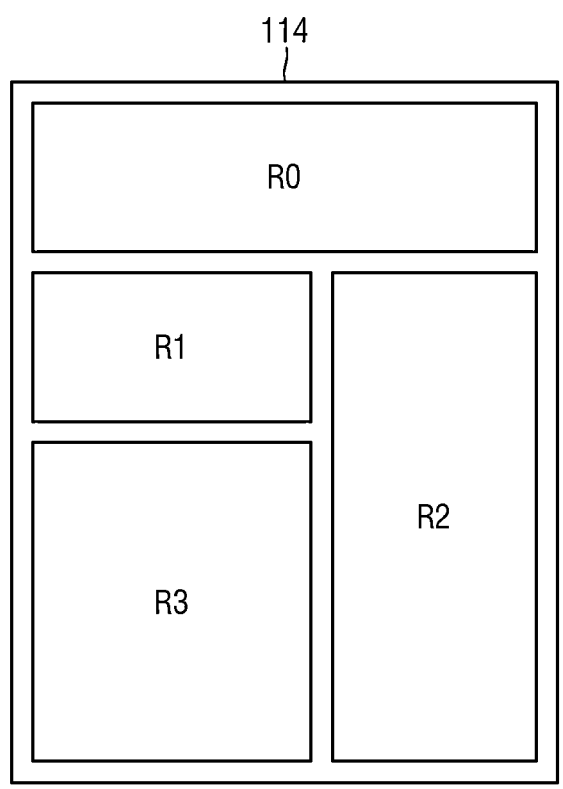
FIGS. 3 and 4 are diagrams for explaining the operation of the processor of the memory controller according to some example embodiments.
Figure 4:
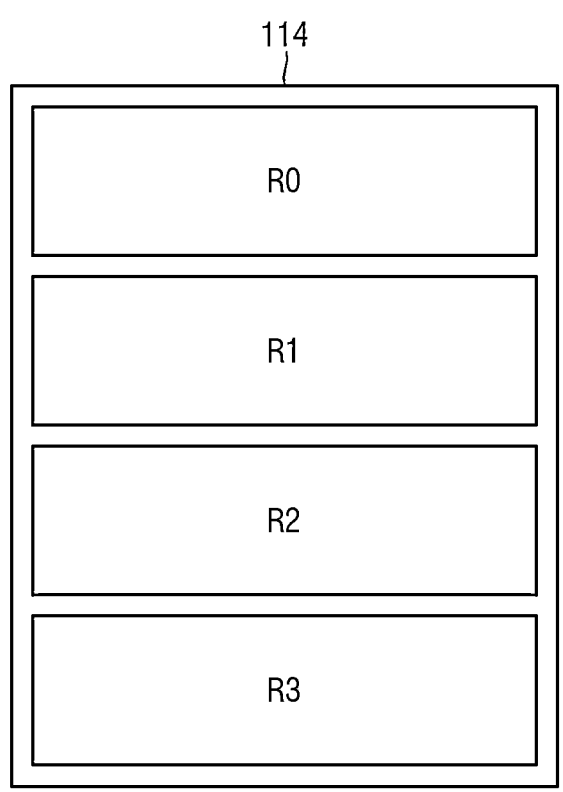

FIGS. 3 and 4 are diagrams for explaining the operation of the processor of the memory controller according to some example embodiments.

Referring to FIGS. 3 and 4, the memory controller (100 of FIG. 1) may include a static random access memory (SRAM) 114. The program buffer memory 111 of the memory controller (100 of FIG. 1) and the first to third program recovery buffer memories 1121 to 1123 may include an SRAM 114. For example, the program buffer memory 111 and the first to third program recovery buffer memories 1121 to 1123 may use the SRAM 114 as a memory. In other words, the SRAM 114 may include the program buffer memory 111 and the first to third program recovery buffer memories 1121 to 1123.

The processor (130 of FIG. 1) of the memory controller (100 of FIG. 1) may designate regions in the SRAM 114 that correspond to the program buffer memory 111 and the first to third program recovery buffer memories 1121 to 1123, respectively.

In some example embodiments, the processor 130 may designate a $0^{th}$ region R0, in which the program buffer memory 111 temporarily stores data to be programmed in the non-volatile memory device 200, in the SRAM 114.

In some example embodiments, the processor 130 may designate a region of the SRAM 114 in which the program recovery buffer memory 112 stores recovery data. For example, the processor 130 may designate a first region R1 in which the first program recovery buffer memory 1121 stores the first recovery data 10, in the SRAM 114. As another example, the processor 130 may designate a second region R2 in which the second program recovery buffer memory 1122 stores the second recovery data 20, in the SRAM 114. As still another example, the processor 130 may designate a third region R3 of the SRAM 114 in which the third program recovery buffer memory 1123 stores the third recovery data 30.

In consideration of the program buffer memory 111 and the capacity of the data to be stored in the program buffer memory 111, the processor 130 may arbitrarily designate the program buffer memory 111 and a region in which the program buffer memory 111 uses the SRAM 114.

FIGS. 5 to 11 are diagrams for explaining the operation of the memory controller according to some example embodiments.

Figure 5:
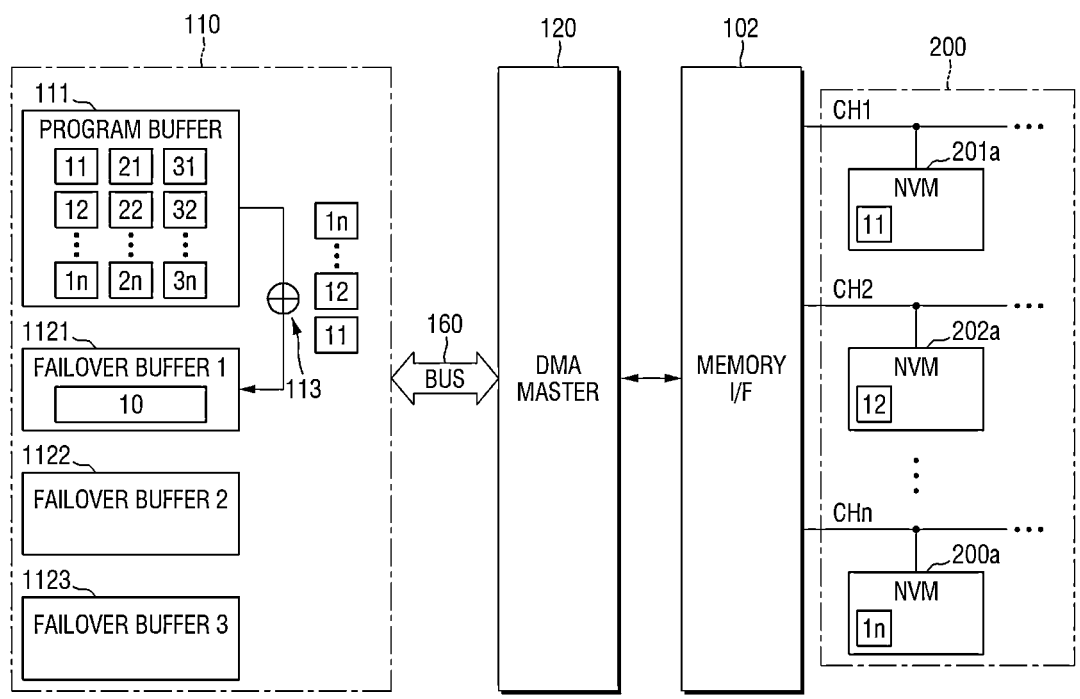
FIGS. 5 to 11 are diagrams for explaining the operation of the memory controller according to some example embodiments.
Figure 6:
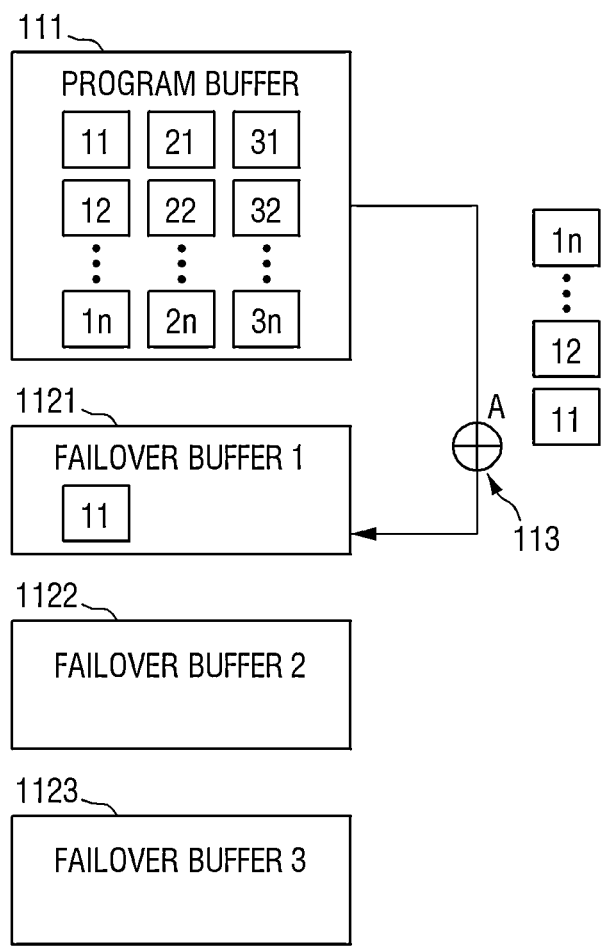
Figure 7:
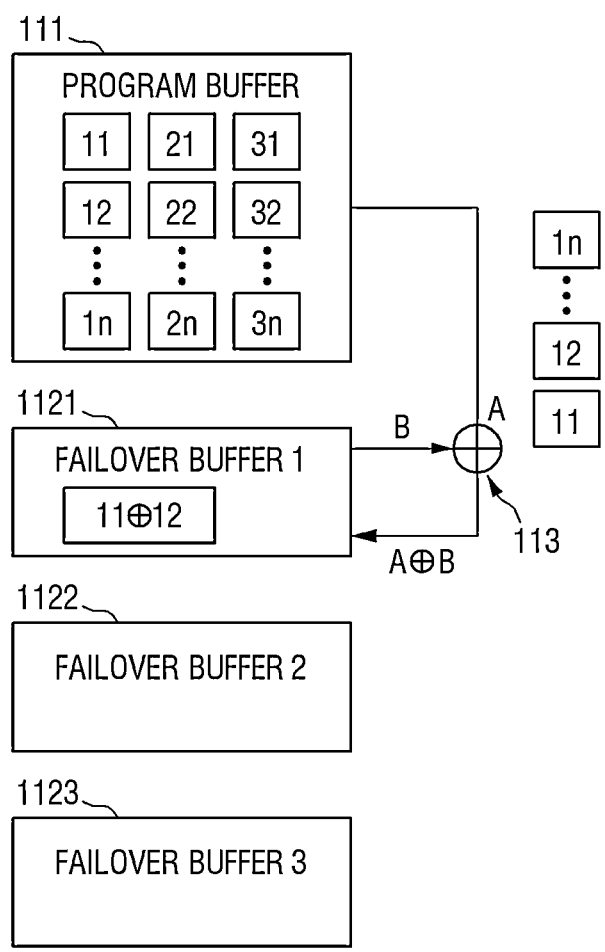
Figure 8:
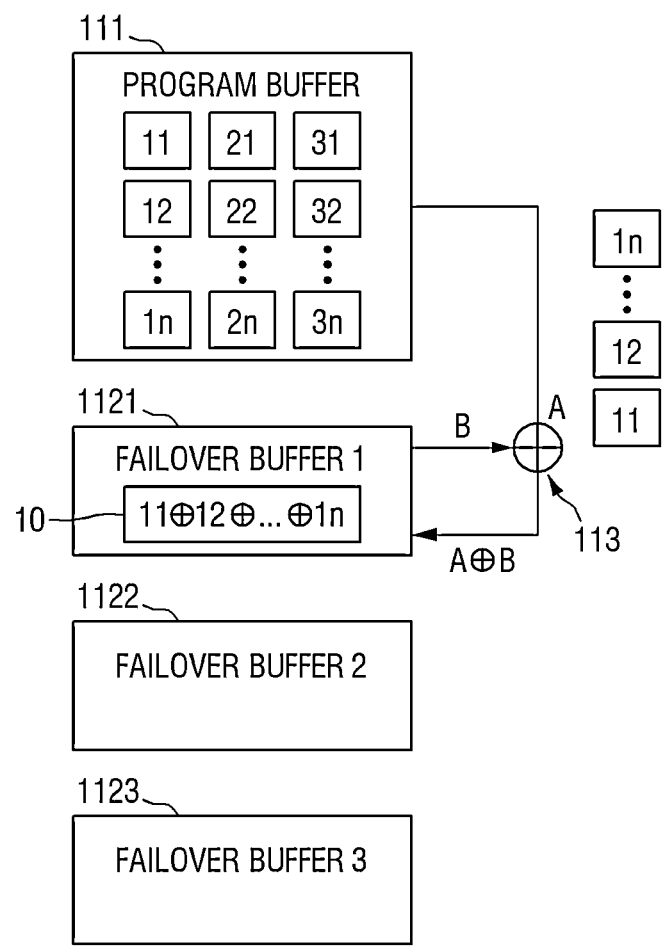
Figure 9:
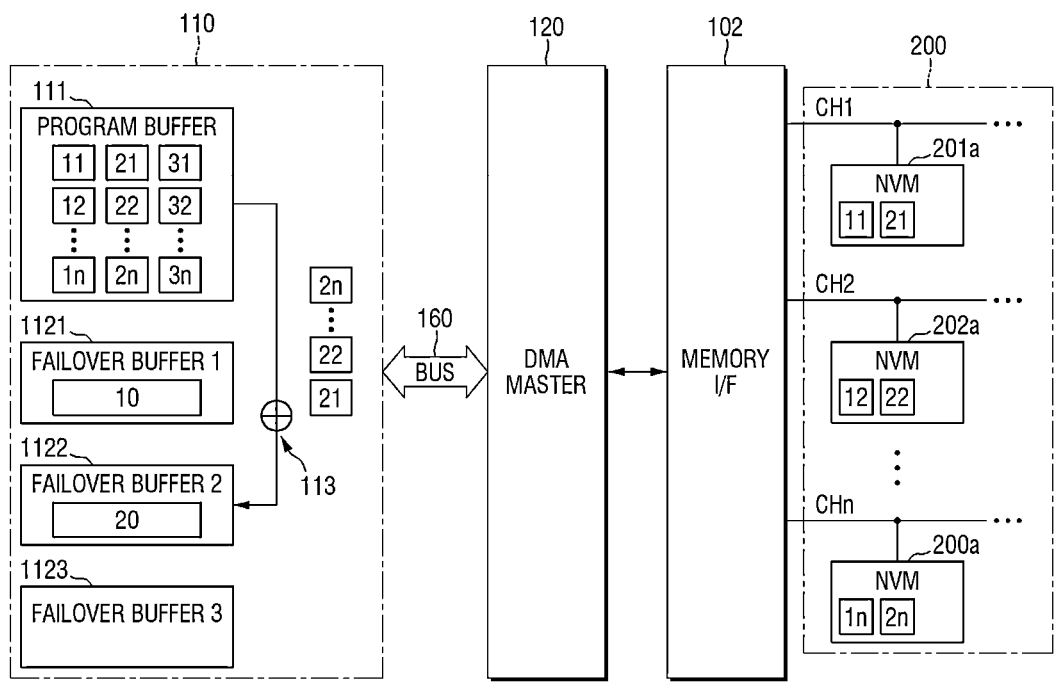
Figure 10:
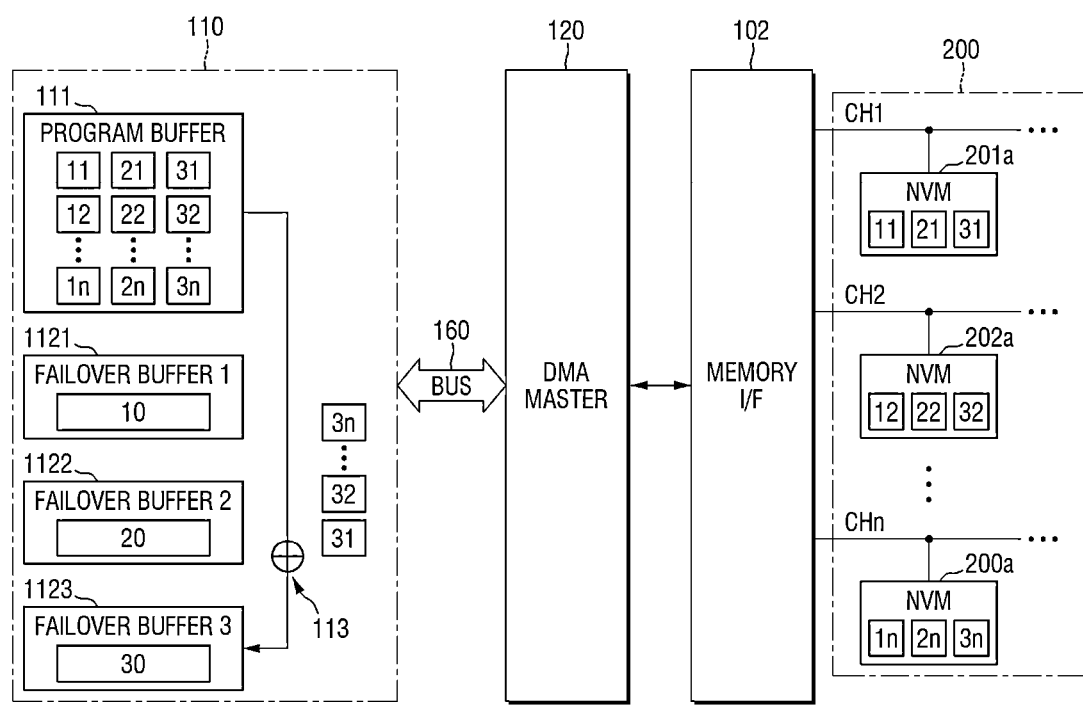

Referring to FIGS. 5, 9 and 10, the processor (130 of FIG. 1) may designate a data group to be provided to the DMA master device 120 from the program buffer memory 111 in response to a request from the DMA master device 120. The processor 130 may designate the data group to be provided to the non-volatile memory device 200 by the DMA master device 120. That is, the processor 130 may designate the data group to be provided to the computing circuit 113 from the program buffer memory 111 after the data group is provided to the non-volatile memory device 200 by the DMA master device 120.

In some example embodiments, the processor 130 may designate a plurality of data 11, 12 . . . 1n programmed on the first page of the plurality of memory chips 201a, 202a . . . 200a, as a first data group to be provided to the non-volatile memory device 200 by the DMA master device 120.

The processor 130 may designate a plurality of data 21, 22 . . . 2n programmed on the second page of the plurality of memory chips 201a, 202a . . . 200a, as a second data group to be provided to the non-volatile memory device 200 by the DMA master device 120.

The processor 130 may designate a plurality of data 31, 32 . . . 3n programmed on the third page of the plurality of memory chips 201a, 202a . . . 200a, as a third data group to be provided to the non-volatile memory device 200 by the DMA master device 120.

Referring to FIGS. 5 to 8 again, the first data groups 11, 12 . . . 1n designated by the processor 130 are provided to the non-volatile memory device 200 by the DMA master device 120, and then the plurality of data included in the data groups 11, 12 . . . 1n are sequentially provided from the program buffer memory 111 to the computing circuit 113.

The computing circuit 113 may perform a desired (or alternatively, predetermined) computation on a plurality of data included in the first data group 11, 12 . . . 1n provided from the program buffer memory 111.

In some example embodiments, the computing circuit 113 may perform an exclusive OR computation, using a plurality of data included in the first data groups 11, 12 . . . 1n provided from the program buffer memory 111, and data stored in the first program recovery buffer memory 1121. The computing circuit 113 may provide the first program recovery buffer memory 1121 with the first recovery data 10 generated by performing a computation on the first data group 11, 12 . . . 1n.

For example, the first data 11 of the first data groups 11, 12 . . . 1n is provided from the program buffer memory 111 to the computing circuit 113. At this time, since the data to be computed together with the first data 11 is not stored in the first program recovery buffer memory 1121, the computing circuit 113 does not perform the exclusive OR computation, and may provide the first data 11 provided from the first program buffer memory 111 to the first program recovery buffer memory 1121.

Subsequently, the second data 12 of the first data groups 11, 12 . . . 1n is provided from the program buffer memory 111 to the computing circuit 113. The computing circuit 113 performs the exclusive OR computation, using the first data 11 stored in the first program recovery buffer memory 1121 and the second data 12 provided from the program buffer memory 111. The computing circuit 113 provides the first program recovery buffer memory 1121 with the data generated by performing the exclusive OR computation using the first data 11 and the second data 12.

Similarly, the computing circuit 113 performs the exclusive OR computation, using a last $n^{th}$ data 1n included in the first data group 11, 12 . . . 1n provided from the program buffer memory 111 and data stored in the first program recovery buffer memory 1121, and finally generates the first recovery data 10 and provides it to the first program recovery buffer memory 1121.

The first program recovery buffer memory 1121 may store the first recovery data 10 that is finally generated by the computing circuit 113 using the first data groups 11, 12 . . . 1n.

Referring to FIGS. 9 and 10, similarly, after the second data groups 21, 22 . . . 2n and the third data groups 31, 32 . . . 3n designated by the processor 130 are provided to the non-volatile memory device 200 by the DMA master device 120, a plurality of data included in the second data group 21, 22 . . . 2n and the third data group 31, 32 . . . 3n are sequentially provided from the program buffer memory 111 to the computing circuit 113.

The computing circuit 113 may provide the second program buffer memory 1122 and the third program recovery buffer memory 1123 with each of the second recovery data 20 and the third recovery data 30 that are finally generated using the second data groups 21, 22 . . . 2n and the third data groups 31, 32 . . . 3n, respectively.

Although FIGS. 5 to 10 show that the computing circuit 113 performs the exclusive OR computation, example embodiment is not limited thereto. The computing circuit 113 may generate recovery data used to complete programming, using other computations, when the program on the non-volatile memory device 200 is not completed.

Figure 11:
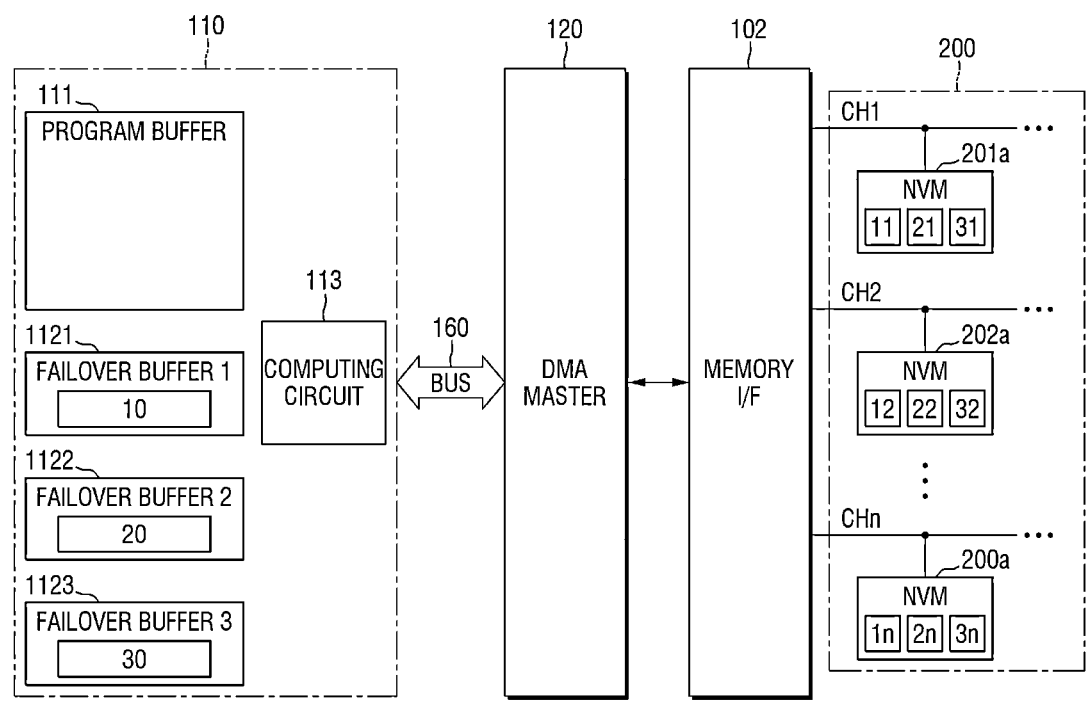

Referring to FIG. 11, when the computing circuit 113 performs the computation on the entire first to third data groups stored in the program buffer memory 111, and provides first recovery data to the third recovery data 10 to 30 to the first to third program recovery buffer memories 1121 to 1123, respectively, and the first to third program recovery buffer memories 1121 to 1123 store the first recovery data to the third recovery data 10 to 30, respectively, the first to third data groups stored in the program buffer memory 111 may be removed. That is, the program buffer memory 111 may be released. Here, the term "release" may refer to a state in which the data stored in the memory is removed and new data may be stored in the region in which the data is stored.

Figure 12:
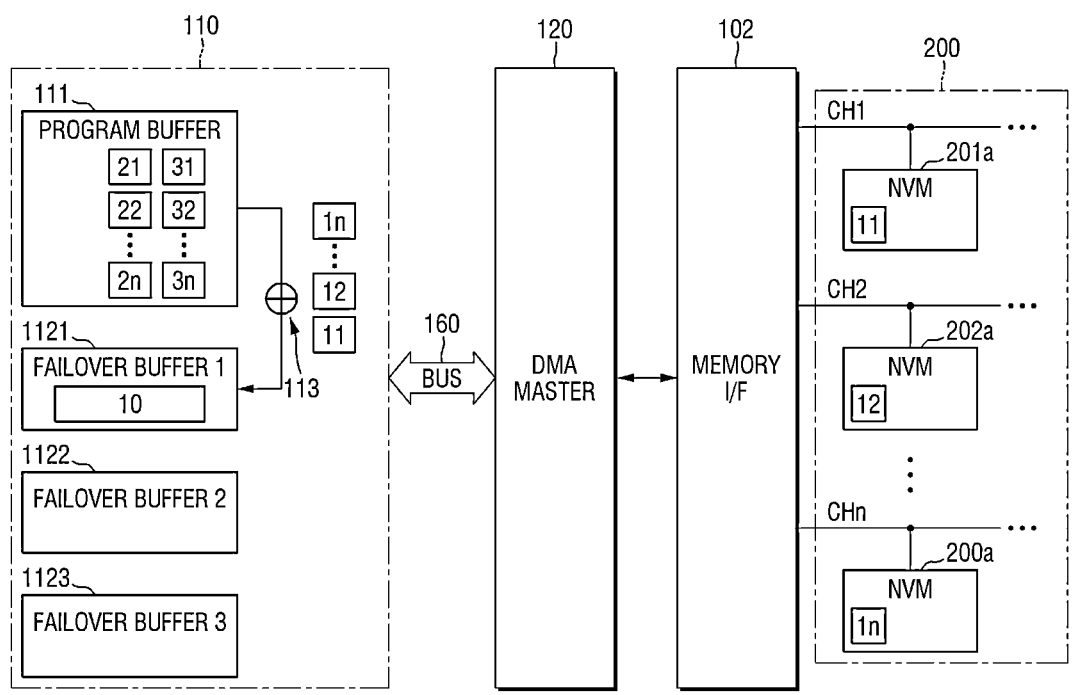
FIGS. 12 to 14 are diagrams for explaining the operation of the memory controller according to some other example embodiments.
Figure 13:
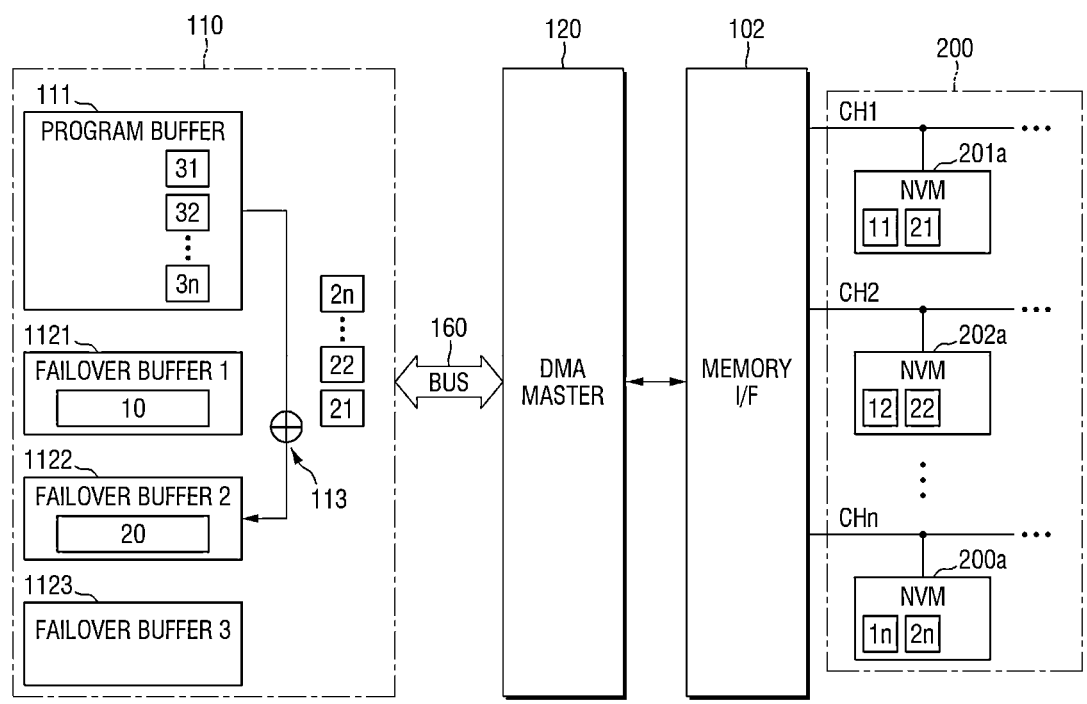
Figure 14:
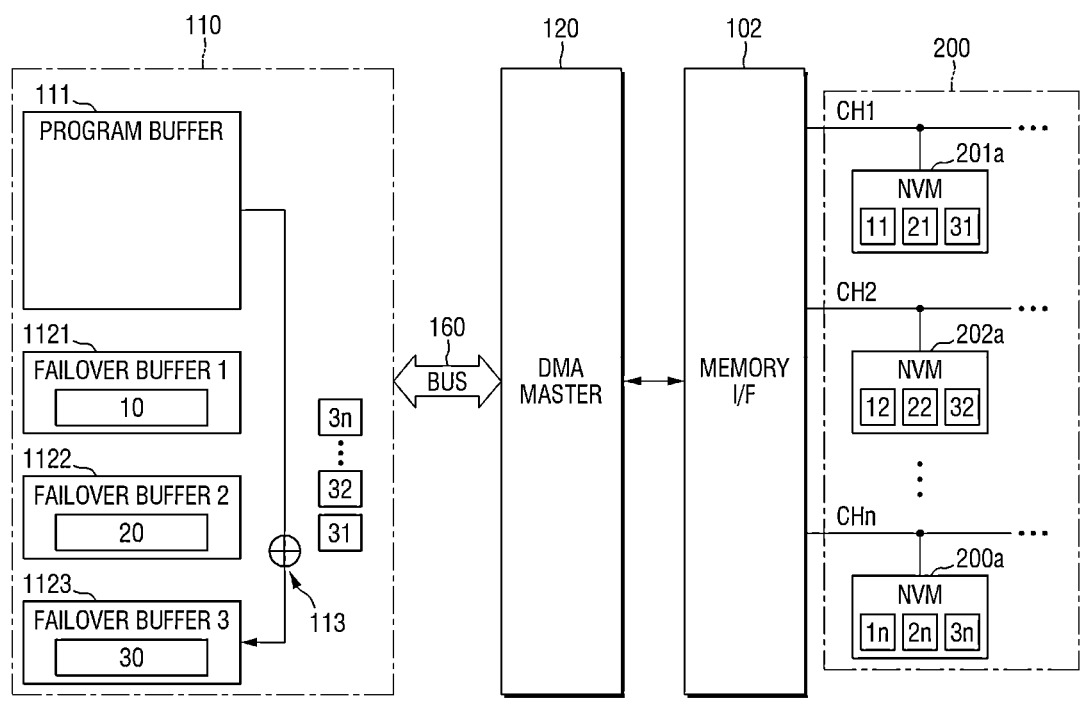

FIGS. 12 to 14 are diagrams for explaining the operation of the memory controller according to some other example embodiments. For convenience of explanation, points different from those described referring to FIGS. 5 to 11 will be mainly described.

Referring to FIGS. 12 to 14, when the computation of the computing circuit 113 on the first data groups 11, 12 . . . 1n is completed and the finally generated first recovery data 10 is stored in the first program recovery buffer memory 1121, the first data group 11, 12 . . . 1n stored in the program buffer memory 111 may be removed. That is, the region in which the first data groups 11, 12 . . . 1n are stored in the program buffer memory 111 may be released.

Subsequently, the computation of the computing circuit 113 on the second data groups 21, 22 . . . 2n is completed, and the finally generated second recovery data 20 is stored in the second program recovery buffer memory 1122, the second data groups 21, 22 . . . 2n stored in the program buffer memory 111 may be removed. That is, the region in which the second data groups 21, 22 . . . 2n are stored in the program buffer memory 111 may be released.

Subsequently, when the computation of the computing circuit 113 on the third data groups 31, 32, . . . 3n is completed and the finally generated third recovery data 30 is stored in the third program recovery buffer memory 1123, the third data group 31, 32 . . . 3n stored in the program buffer memory 111 may be removed. That is, the region in which the third data group 31, 32 . . . 3n are stored in the program buffer memory 111 may be released.

In such a case, unlike the case described referring to FIG. 11, the timing at which the release of the program buffer memory 111 starts may become earlier. For example, when the recovery data is stored in any one program recovery buffer memory in the program recovery buffer memory 112, the corresponding data group may be removed from the program buffer memory 111.

In the case described referring to FIG. 11, after the recovery data is stored in all the program recovery buffer memories 112, all the data groups stored in the program buffer memory 111 are removed at once, and the program buffer memory 111 may be released. In contrast, in the case described referring to FIGS. 12 to 14, storage of the recovery data in the program recovery buffer memory 112, and removal of the data group stored in the program buffer memory 111 corresponding to the stored recovery data may be performed alternately.

Figure 15:
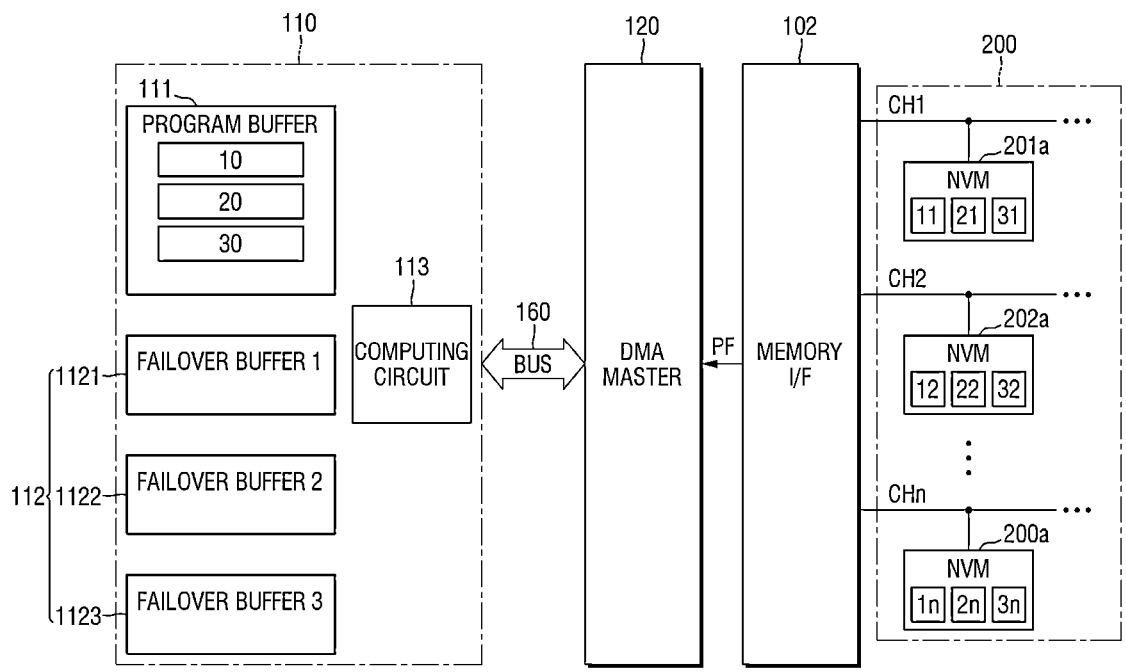
FIGS. 15 and 16 are diagrams for explaining the operation of the memory controller according to some example embodiments.
Figure 16:
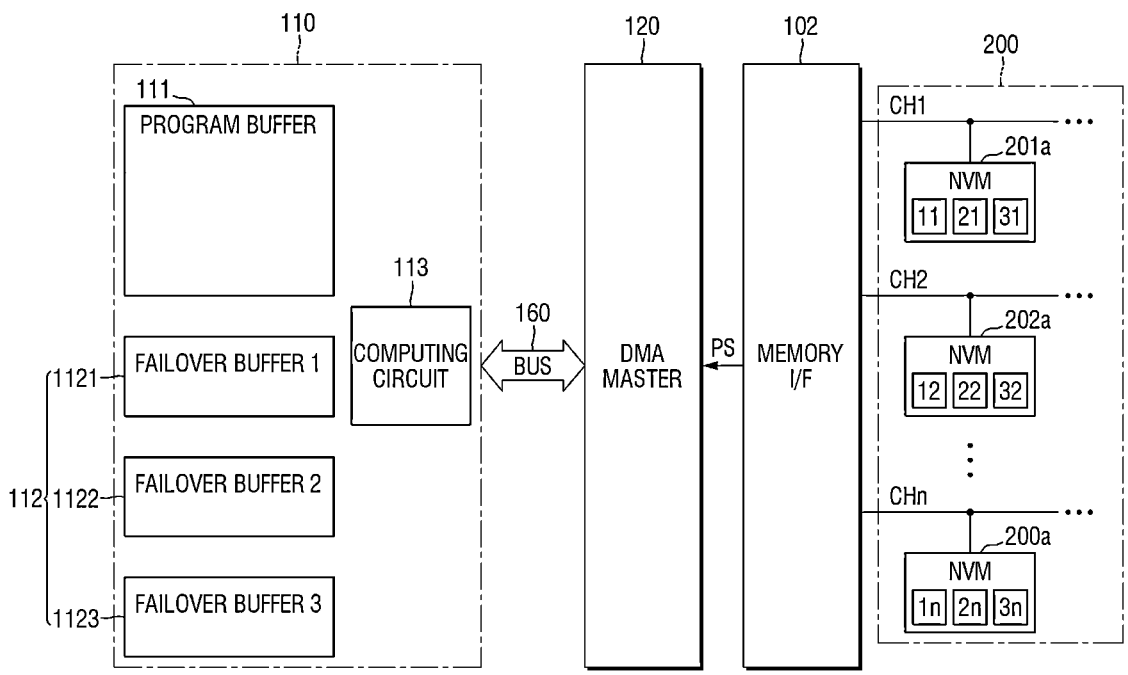

FIGS. 15 and 16 are diagrams for explaining the operation of the memory controller according to some example embodiments.

Referring to FIG. 15, when a program failure signal PF indicating that the data provided from the memory controller 100 are not completely programmed in the non-volatile memory device 200 is provided from the non-volatile memory device 200 to the memory controller 100, the first recovery data to the third recovery data 10 to 30 stored in the program recovery buffer memory 112 may be provided to the program buffer memory 111.

For example, the non-volatile memory device 200 may provide the program failure signal PF to the memory controller 100 when the program of the provided data is not completed. In response to the program failure signal PF, the program recovery buffer memory 112 may provide the stored recovery data to the program buffer memory 111.

The processor (130 of FIG. 1) computes the recovery data provided to the program buffer memory 111 with the data group provided to the non-volatile memory device 200, and may perform a control so that the data group is programmed to the non-volatile memory device 200 again.

Although FIG. 15 shows that the first recovery data to the third recovery data 10 to 30 stored in the first to third program recovery buffer memories 112 are all provided to the program buffer memory 111 in response to the program failure signal PF, example embodiments are not limited thereto.

In some example embodiments, the non-volatile memory device 200 may provide the memory controller 100 with a program failure signal PF for a particular data group for which the program has not completed. The processor 130 may perform a control so that only the recovery data of a specific data group (e.g., the particular data group) corresponding to the page in which the program has not been completed are provided from the program recovery buffer memory 112 to the program buffer memory 111 in response to the program failure signal PF.

For example, when the program failure signal PF indicating that the programming on the first data groups 11, 12 . . . 1n is not completed is provided from the non-volatile memory device 200, the first recovery data 10 may be provided from the first program recovery buffer memory 1121 to the program buffer memory 111. At this time, the second recovery data and the third recovery data 20 and 30 may not be provided from the second and third program recovery buffer memories 1122 and 1123 to the program buffer memory 111.

Referring to FIG. 16, when a program success signal PS is provided to the memory controller 100 from the non-volatile memory device 200, the first recovery data to the third recovery data 10 to 30 stored in the first to third program recovery buffer memory 112 may be removed. That is, when the provided first to third data groups are completely programmed in the non-volatile memory device 200, the first to third program recovery buffer memory 112 may be released.

The released first to third program recovery buffer memory 112 may be utilized for other usages depending on the operation of the memory controller 100. In some example embodiments, when the memory controller 100 receives the read data from the non-volatile memory device 200 according to a command from the host (300 of FIG. 18), the first to third program recovery buffer memory 112 may be used as a buffer memory that temporarily stores the read data provided from the non-volatile memory device 200 before providing the read data to the host (300 of FIG. 18).

In some other example embodiments, the released first to third program recovery buffer memory 112 may be used as a memory that stores mapping information between a logical address in the data host (300 of FIG. 18) and a physical address in the non-volatile memory device 200. The released first to third program recovery buffer memory 112 may be used as a buffer memory that is temporarily provided with a mapping table so that the memory controller 100 performs the computation using the mapping table stored in the non-volatile memory device 200.

Figure 17:
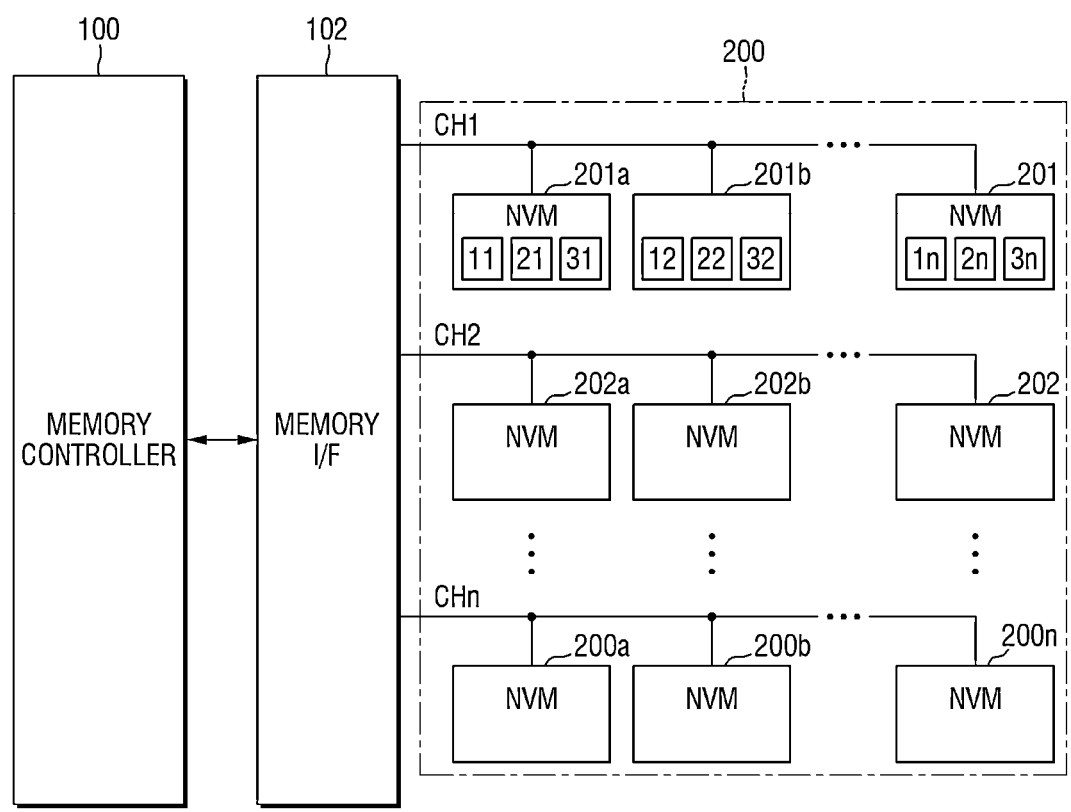
FIG. 17 is a diagram for explaining the operation of the memory controller according to some other example embodiment.

FIG. 17 is a diagram for explaining the operation of the memory controller according to some other example embodiment. For convenience of explanation, points different from those described referring to FIGS. 5 to 11 will be mainly described.

Referring to FIG. 17, the processor (130 of FIG. 1) may designate a plurality of data 11, 12 . . . 1n programmed on the first page of each of the plurality of memory chips 201a, 201b . . . 201 of the non-volatile memory device 200 connected to the memory controller 100 through the first channel CH1, as the first data group provided by the DMA master device (120 of FIG. 1) to the non-volatile memory device 200.

The processor (130 of FIG. 1) may designate a plurality of data 21, 22 . . . 2n programmed on the second page of each of the plurality of memory chips 201a, 201b . . . 201 of the non-volatile memory device 200 connected to the memory controller 100 through the first channel CH1, as the second data group provided by the DMA master device (120 of FIG. 1) to the non-volatile memory device 200.

The processor (130 of FIG. 1) may designate a plurality of data 31, 32 . . . 3n programmed on the third page of each of the plurality of memory chips 201a, 201b . . . 201 of the non-volatile memory device 200 connected to the memory controller 100 through the first channel CH1, as a third data group provided by the DMA master device (120 of FIG. 1) to the non-volatile memory device 200.

That is, the processor (130 of FIG. 1) may designate the data group provided by the DMA master device (120 of FIG. 1) to the non-volatile memory device 200 differently depending on example embodiments. As a result, the data group provided from the program buffer memory 111 to the computing circuit 113 may also be changed.

Figure 18:
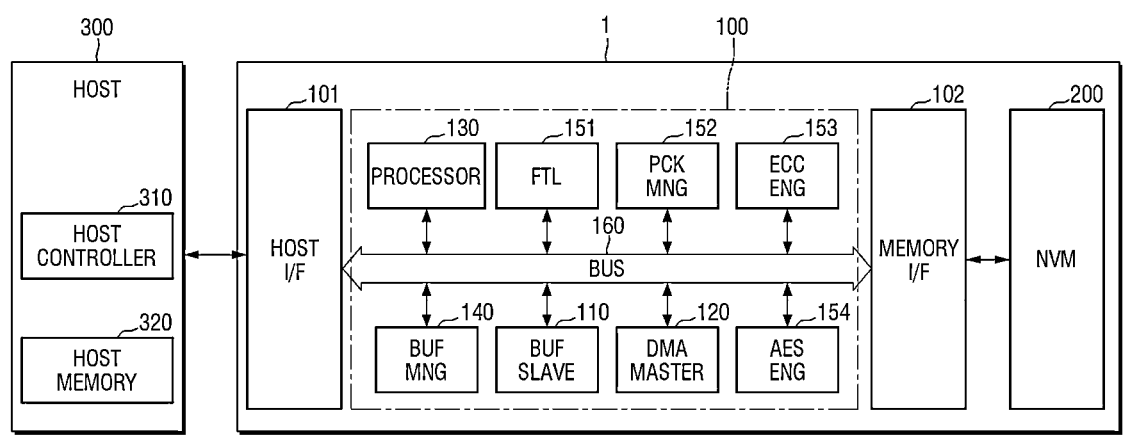
FIG. 18 is a diagram for explaining a storage device according to some example embodiments.
Figure 19:
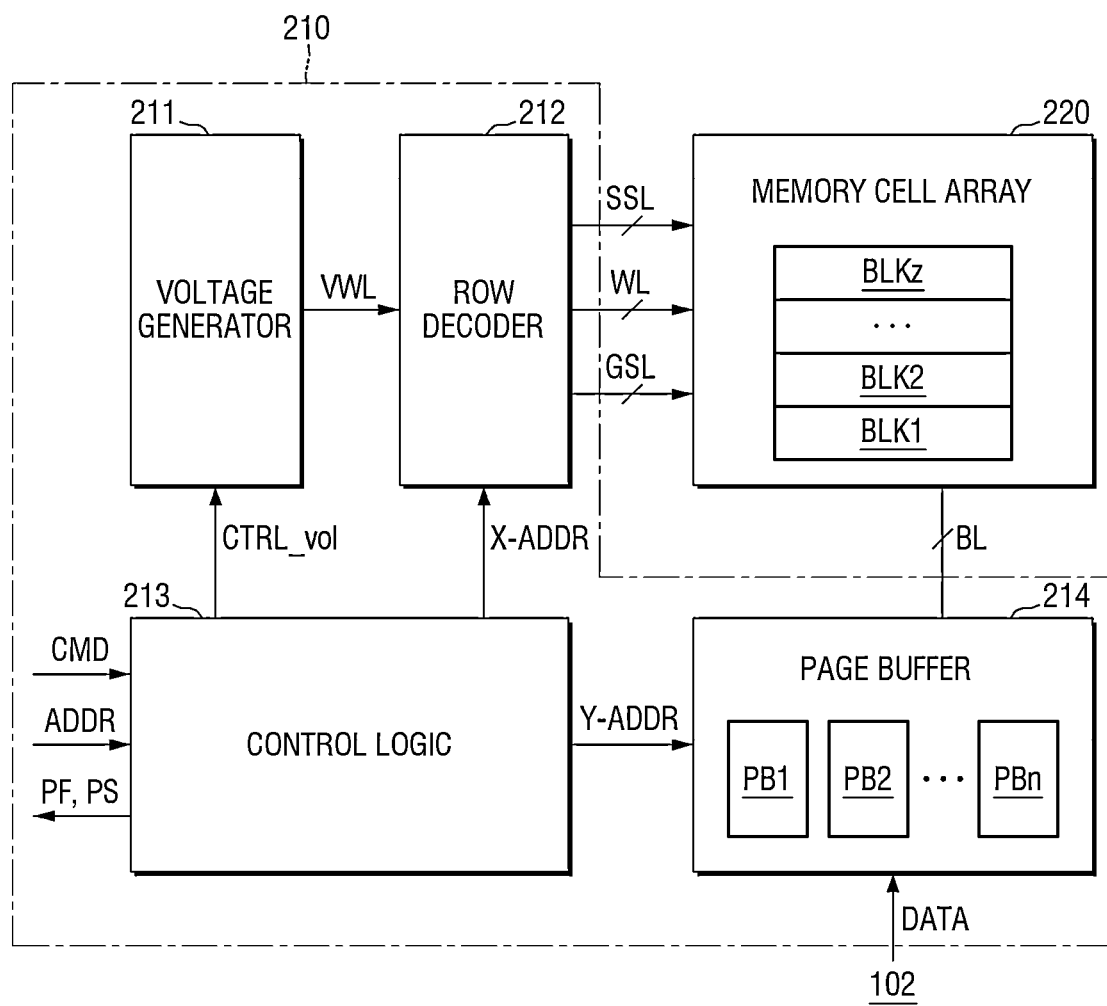
FIG. 19 is a diagram for explaining a non-volatile memory device included in the storage device according to some example embodiments.

FIG. 18 is a diagram for explaining a storage device according to some example embodiments. FIG. 19 is a diagram for explaining a non-volatile memory device included in the storage device according to some example embodiments.

Referring to FIG. 18, the storage device 1 may include a memory controller 100 and a non-volatile memory device 200. The storage device 1 may send and receive commands and data to and from the host 300.

The host 300 may include a host controller 310 and a host memory 320.

The host controller 310 and the host memory 320 may be implemented as separate semiconductor chips. Alternatively, in some example embodiments, the host controller 310 and the host memory 320 may be integrated on the same semiconductor chip. As an example, the host controller 310 may be one of a plurality of modules provided in an application processor, and the application processor may be implemented as a system on chip (SoC). Further, the host memory 320 may be an embedded memory provided inside the application processor, or may be a non-volatile memory or a memory module placed outside the application processor.

The host controller 310 may manage an operation of storing data (e.g., record data) of the buffer region of the host memory 320 in the non-volatile memory device 200, or storing data (e.g., read data) of the non-volatile memory device 200 in the buffer region.

The storage device 1 may include storage medium for storing data in response to a request from the host device 300. As an example, the storage device 1 may include at least one of a Solid State Drive (SSD), an embedded memory, and a detachable external memory. When the storage device 1 is an SSD, the storage device 1 may be, for example, a device that complies with a non-volatility memory express (NVMe) standard. When the storage device 1 is an embedded memory or an external memory, the storage device 1 may be a device that complies with a UFS (universal flash storage) or an eMMC (embedded multimedia card) standard. The host device 300 and the storage device 1 may each generate and transmit packets according to the adopted standard protocol.

When the non-volatile memory device 200 of the storage device 1 includes a flash memory, the flash memory may include a 2D NAND memory array or a 3D (or vertical) NAND (VNAND) memory array. As another example, the storage device 1 may include various different types of nonvolatile memories. For example, the storage device 1 may include a MRAM (Magnetic RAM), a spin-transfer torque MRAM, a conductive bridging RAM (CBRAM), a FeRAM (Ferroelectric RAM), a PRAM (Phase RAM), a resistive memory (Resistive RAM), and various other types of memories.

The memory controller 100 according to some example embodiments may be connected to the host 300 through the host interface 101, and may be connected to the non-volatile memory device 200 through the memory interface 102. The memory controller 100 may include a buffer slave device 110, a DMA master device 120, a processor 130, a buffer manager 140, a flash translation layer (FTL) 151, a packet manager 152, an ECC (error correction code) engine 153, and an AES (advanced encryption standard) engine 154.

The memory controller 100 may further include a working memory (not shown) into which the flash translation layer (FTL) 215 is loaded, and when the processor 130 executes the flash translation layer, the data program and read operations on the non-volatile memory device 200 may be controlled.

The host interface 101 may transmit and receive packets to and from the host 300. The packets transmitted from the host 300 to the host interface 101 may include a command, data to be written on the non-volatile memory device 200, or the like. The packets transmitted from the host interface 101 to the host 300 may include a response to the command, data that is read from the non-volatile memory device 200 or the like.

The memory interface 102 may transmit the data to be written on the non-volatile memory device 200 to the non-volatile memory device 200 or receive the data that is read from the non-volatile memory device 200. Such a memory interface 102 may be implemented to comply with standard protocols such as Toggle or Open NAND Flash Interface (ONFI).

The flash translation layer 151 may perform various functions such as address mapping, wear-leveling, and garbage collection. The address mapping operation is an operation of changing a logical address received from the host 300 into a physical address which is used for actually storing the data in the non-volatile memory device 200. The wear-leveling is a technique for ensuring that blocks in the non-volatile memory device 200 are used uniformly to prevent an excessive degradation of a particular block, and may be implemented, for example, through a firmware technique for balancing the erasure counts of the physical blocks. The garbage collection is a technique for ensuring an available capacity in the non-volatile memory device 200 through a method of copying the valid data of the block to a new block and then erasing the existing block.

The packet manager 152 may generate a packet according to the protocol of the interface discussed with the host 300, or may parse various types of information from the packet received from the host 300.

The ECC engine 153 may perform error detection and correction functions on the read data that is read from the non-volatile memory device 200. For example, the ECC engine 153 may generate parity bits for the program data to be programmed on the non-volatile memory device 200. The parity bits thus generated may be stored in the non-volatile memory device 200 together with the program data. When reading the data from the non-volatile memory device 200, the ECC engine 153 may correct an error of the read data, using the parity bits that are read from the non-volatile memory device 200, together with the read data, and output the read data with a corrected error.

The AES engine 154 may perform at least one of an encryption operation and a decryption operation on the data that are input to the memory controller 100, using a symmetric-key algorithm. The AES engine 154 may be included in the DMA master device 120. In contrast, the AES engine 154 may be included in the memory controller 100 in a different configuration from that of the DMA master device 120.

The buffer slave device 110 may store the data necessary to program the data in the non-volatile memory device 200. Further, the buffer slave device 110 may store recovery data necessary to complete the program when the program on the non-volatile memory device 200 fails.

The DMA master device 120 may request the buffer slave device 110 for data to be programmed on the non-volatile memory device 200. The DMA master device 120 may provide the data to be programmed provided from the buffer slave device 110 to the non-volatile memory device 200.

The processor 130 may control the overall operation of the memory controller 100. The processor 130 may perform the control so that the program is completed, when the program on data of the non-volatile memory device 200 fails, by performing computation using the recovery data stored in the program recovery buffer memory 112 of the buffer slave device 110 and the data provided to the non-volatile memory device 200.

The buffer manager 140 may control the program buffer memory 111 and the program recovery buffer memory 112 of the buffer slave device 110. For example, the buffer manager 140 may write data in the region of the SRAM 114 used by the program buffer memory 111 and the program recovery buffer memory 112. As another example, the program buffer memory 111 and the program recovery buffer memory 112 may read the data stored in the SRAM 114. The buffer manager 140 may be omitted depending on example embodiments. As still another example, the buffer manager 140 may control the operation in which the program buffer memory 111 provides the data group to the computing circuit 113, and the operation in which the computing circuit 113 provides the recovery data to the program recovery buffer memory 112.

Referring to FIG. 19, the non-volatile memory device 200 may include a peripheral circuit 210 and a memory cell array 220. The peripheral circuit 210 may include a voltage generator 211, a row decoder 212, a control logic circuit 213, and a page buffer 214. Although not shown in FIG. 19, the peripheral circuit 210 may further include an input/output interface, a column logic, a pre-decoder, a temperature sensor, a command decoder, an address decoder, an amplifier circuit, and the like.

The voltage generator 211 may generate various types of voltages for performing program, read, and erasure operations on the basis of a voltage control signal. For example, the voltage generator 211 may generate a program voltage, a read voltage, a program verification voltage, an erasure voltage, and the like, as a word line voltage VWL.

The row decoder 212 may select one of a plurality of word lines WL in response to a row address X-ADDR, and select one of a plurality of string selection lines SSL. For example, the row decoder 212 may apply a program voltage and a program verification voltage to the selected word line at the time of the program operation. As another example, the row decoder 212 may apply a read voltage to the selected word line at the time of the read operation.

The memory cell array 220 may include a plurality of memory blocks. Each of the plurality of memory blocks may include a plurality of memory cells. The memory cell array 220 may be connected to the page buffer 214 through the bit lines BL. The memory cell array 220 may be connected to the row decoder 212 through word lines WL, string selection lines SSL, and ground selection lines GSL.

The control logic circuit 213 may generally control various operations inside the non-volatile memory device 200. The control logic circuit 213 may output various control signals in response to the command CMD and/or the address ADDR from the memory interface 102. For example, the control logic circuit 213 may output a voltage control signal CTRL_vol, a row address X-ADDR, and a column address Y-ADDR.

The control logic circuit 213 may transmit the program success signal PS or the program failure signal PF to the memory controller 100, depending on whether program of the data corresponding to the program command is successful, according to the program command provided from the memory controller 100 through the memory interface 102.

The control logic circuit 213 may transmit the program success signal PS to the memory controller 100, when the program of the data provided from the memory controller 100 is successfully completed in the memory controller array 220.

The control logic circuit 213 may transmit the program failure signal PF to the memory controller 100, when the program of the data provided from the memory controller 100 is not completed in the memory cell array 220.

The page buffer 214 may include a plurality of page buffers PB1 to PBn (n is an integer of 3 or more), and the plurality of page buffers PB1 to PBn may be connected to each of the memory cells through a plurality of bit lines BL. The page buffer 214 may select at least one bit line among the bit lines BL in response to the column address Y-ADDR. The page buffer 214 may operate as a write driver or a sense amplifier depending on the operating mode. For example, at the time of program operation, the page buffer 214 may apply a bit line voltage corresponding to the data to be programmed to the selected bit line BL. At the time of the read operation, the page buffer 214 may sense the current or voltage of the selected bit line BL to sense the data stored in the memory cell.

The page buffer 214 may be provided with data that is programmed to the memory cell array 220 from the DMA master device 120 of the memory controller 100.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the disclosed example embodiments without substantially departing from the principles of the present inventive concepts. Therefore, the disclosed example embodiments of the present inventive concepts are used in a generic and descriptive sense only and not for purposes of limitation.

What is claimed is:

1. A memory controller comprising:
a direct memory access (DMA) master device configured to provide a first data group to a non-volatile memory device;
a program buffer memory configured to temporarily store the first data group before the DMA master device provides the first data group to the non-volatile memory device;
an exclusive OR computing circuit configured to perform an exclusive OR computation and an accumulation on a plurality of data included in the first data group provided from the program buffer memory and generate a first recovery data, after the DMA master device provides the first data group to the non-volatile memory device; and
a buffer slave device including a first program recovery buffer memory configured to store the first recovery data,
wherein the buffer slave device is connected to the DMA master device through a bus, and
the buffer slave device is configured to provide the first recovery data from the first program recovery buffer memory to the program buffer memory, in response to a program failure signal indicating that programming of the first data group on the non-volatile memory device is not completed.

2. The memory controller of claim 1, wherein the program buffer memory is configured to provide the first data group to the exclusive OR computing circuit without using the DMA master device, and the exclusive OR computation is configured to provide the first recovery data to the first program recovery buffer memory, without using the DMA master device.

3. The memory controller of claim 1, wherein
the non-volatile memory device includes a plurality of memory chips, the plurality of memory chips including a first memory chip connected to the memory controller through a first channel, and a second memory chip connected to the memory controller through a second channel, and
the first data group includes data programmed on a first page of the first memory chip, and data programmed on a first page of the second memory chip.

4. The memory controller of claim 3, further comprising:
a second program recovery buffer memory configured to store a second recovery data,
wherein the second recovery data includes data in which the exclusive OR computing circuit performs the exclusive OR computation and accumulation on a plurality of data included in a second data group, after the DMA master device provides the second data group to the non-volatile memory device, and
the second data group includes data programmed on a second page of the first memory chip, and data programmed on a second page of the second memory chip.

5. The memory controller of claim 1, wherein
the non-volatile memory device includes a page buffer connected to a memory cell array through a bit line, and
the DMA master device is configured to provide the first data group to the page buffer.

6. The memory controller of claim 1, further comprising:
a second program recovery buffer memory configured to store a second recovery data, the second recovery data generated by cumulatively computing a plurality of data included in a second data group through the exclusive OR computing circuit, after the DMA master device provides the second data group to the non-volatile memory device,
wherein the memory controller is configured to
program the first data group to a first memory chip connected to the memory controller through a first channel, and
program the second data group to a second memory chip connected to the memory controller through a second channel.

7. The memory controller of claim 1, further comprising:
a static random access memory (SRAM) used as a buffer memory; and
a processor configured to control the DMA master device, the buffer slave device, and the SRAM,
wherein the processor is further configured to designate a first region in the SRAM that corresponds to the program buffer memory configured to temporarily store the first data group, and
the processor is further configured to designate a second region in the SRAM that corresponds to the first program recovery buffer memory configured to store the first recovery data.

8. The memory controller of claim 1, wherein the buffer slave device is configured to provide the first data group from the program buffer memory to the exclusive OR computing circuit, in response to a situation in which the DMA master device completes provision of the first data group to the non-volatile memory device.

9. The memory controller of claim 1, further comprising:
a processor is configured to control the DMA master device and the buffer slave device,
wherein the processor is configured to control the first data group stored in the program buffer memory to be provided to the exclusive OR computing circuit, after the DMA master device completes provision of the first data group to the non-volatile memory device.

10. The memory controller of claim 1, wherein the buffer slave device is further configured to remove the first recovery data from the first program recovery buffer memory, in response to a program success signal indicating that programming of the first data group on the non-volatile memory device is completed.

11. The memory controller of claim 1, wherein after the first recovery data is stored in the first program recovery buffer memory, the buffer slave device is further configured to remove the first data group stored in the program buffer memory.

12. A storage device comprising:
a non-volatile memory device configured to be programmed with a first data group;
a direct memory access (DMA master device configured to provide the first data group to the non-volatile memory device; and
a memory controller including a buffer slave device connected to the DMA master device by a bus,
wherein the buffer slave device includes
a program buffer memory configured to temporarily store the first data group, before the DMA master device provides the first data group to the non-volatile memory device, and
a first program recovery buffer memory configured to store a first recovery data generated by performing a computation on the first data group in response to provision of the first data group, after the DMA master device completes provision of the first data group to the non-volatile memory device.

13. The storage device of claim 12, wherein
a static random access memory (SRAM) includes the program buffer memory and the first program recovery buffer memory,
the memory controller further includes a processor configured to control the DMA master device and the buffer slave device,
the processor is further configured to designate a region in the SRAM that corresponds to the program buffer memory configured to store the first data group, and
the processor is further configured to designate a region in the SRAM that corresponds to the first program recovery buffer memory configured to store the first recovery data.

14. The storage device of claim 12, wherein after the first recovery data is stored in the first program recovery buffer memory, the memory controller is further configured to remove the first data group stored in the program buffer memory.

15. The storage device of claim 12, wherein the buffer slave device is configured to provide the first recovery data from the first program recovery buffer memory to the program buffer memory, in response to a program failure signal from the non-volatile memory device, the program failure signal indicating that programming of the first data group on the non-volatile memory device is not completed.

16. The storage device of claim 12, wherein the buffer slave device is configured to release the first program recovery buffer memory, in response to a program success signal from the non-volatile memory device, the program success signal indicating that programming of the first data group on the non-volatile memory device provided is completed.

17. A memory controller comprising:
a direct memory access (DMA) master device configured to provide a first data group to a non-volatile memory device;
a program buffer memory configured to temporarily store the first data group, before the DMA master device provides the first data group to the non-volatile memory device;
a buffer slave device including a first program recovery buffer memory, the first program recovery buffer memory configured to store a first recovery data generated by performing a computation on a plurality of data included in the first data group provided from the program buffer memory, after the DMA master device provides the first data group to the non-volatile memory device;
a SRAM including the program buffer memory and the first program recovery buffer memory; and
a processor configured to control the DMA master device, the buffer slave device, and the SRAM,
wherein the processor is further configured to designate a region in the SRAM that corresponds to the program buffer memory configured to store the first data group, and
the processor is further configured to designate a region in the SRAM that corresponds to the first program recovery buffer memory configured to store the first recovery data.

18. The memory controller of claim 17, wherein after the first recovery data is stored in the first program recovery buffer memory, the processor is further configured to remove the first data group from the program buffer memory.

19. The memory controller of claim 17, wherein the computation includes an exclusive OR computation.

20. The memory controller of claim 17, wherein
the processor is further configured to provide the first recovery data from the first program recovery buffer memory to the program buffer memory, in response to a program failure signal indicating that programming of the first data group on the non-volatile memory device is not completed, and
the processor is further configured to remove the first recovery data from the first program recovery buffer memory, in response to a program success signal indicating that the programming of the first data group on the non-volatile memory device is completed.

\* \* \* \* \*